US012808939B2

(12) United States Patent
Ding et al.

(10) Patent No.: US 12,808,939 B2
(45) Date of Patent: Nov. 24, 2026

(54) BATTERY MODULE CAPACITY CALCULATION AND POWER RECHARGE CONTROL METHODS, SYSTEMS, EQUIPMENT AND MEDIA

(71) Applicant: Makesense Energy Technology Co., Limited, Shanghai (CN)

(72) Inventors: Peng Ding, Shanghai (CN); Xiao Yan, Shanghai (CN); Enhai Zhao, Shanghai (CN); Qiqi Yin, Shanghai (CN); Haowen Ren, Shanghai (CN); Yuan Feng, Shanghai (CN); Weikun Wu, Shanghai (CN); Decheng Wang, Shanghai (CN)

(73) Assignee: Makesense Energy Technology Co., Limited., Shanghai (CN)

( * ) Notice: Subject to any disclaimer, the term of this patent is extended or adjusted under 35 U.S.C. 154(b) by 0 days.

(21) Appl. No.: 18/573,446

(22) PCT Filed: Jul. 11, 2023

(86) PCT No.: PCT/CN2023/106760
§ 371 (c)(1),
(2) Date: Dec. 22, 2023

(87) PCT Pub. No.: WO2024/109107
PCT Pub. Date: May 30, 2024

(65) Prior Publication Data

US 2025/0277860 A1 Sep. 4, 2025

(30) Foreign Application Priority Data

Nov. 21, 2022 (CN) ......................... 202211461305.3

(51) Int. Cl.
*G01R 31/3842* (2019.01)
*G01R 31/367* (2019.01)
(Continued)

(52) U.S. Cl.
CPC ....... *G01R 31/3842* (2019.01); *G01R 31/367* (2019.01); *G01R 31/396* (2019.01); *H01M 10/441* (2013.01)

(58) Field of Classification Search
CPC ............. G01R 31/3842; G01R 31/367; G01R 31/396; G01R 31/36; H01M 10/441;
(Continued)

(56) References Cited

U.S. PATENT DOCUMENTS

2006/0220619 A1 10/2006 Namba et al.
2007/0069693 A1 3/2007 Patino et al.
2023/0118311 A1* 4/2023 Asai .................... G01R 31/392 324/434

FOREIGN PATENT DOCUMENTS

CN 105226768 A 1/2016
CN 109664795 A 4/2019
(Continued)

*Primary Examiner* — Garcia Ade
(74) *Attorney, Agent, or Firm* — IPRTOP LLC

(57) ABSTRACT

A method for capacity calculation of a battery module includes: acquire the historical charge and discharge parameters of each battery in the battery module, select a reference battery that meet preset charge and discharge conditions, and obtain remaining batteries in the battery module; obtain relative capacity of each remaining battery relative to the reference battery; determine batteries that meet the preset capacity conditions based on the relative capacities as target capacities; obtain increasable capacity of the battery module based on the target capacities. The calculation of the increasable capacity of the battery module is performed before the battery module is recharged, so that the operation and maintenance personnel can know whether the battery module needs to be recharged and whether the capacity of the battery module after recharging has increased, which optimizes recharge process, improves recharge efficiency, and improves operation and maintenance efficiency.

11 Claims, 9 Drawing Sheets

(51) Int. Cl.
*G01R 31/396* (2019.01)
*H01M 10/44* (2006.01)

(58) Field of Classification Search
CPC ........ H01M 2010/4271; H01M 10/482; B60L 53/00; B60L 58/12; B60L 58/22; Y02E 60/10
See application file for complete search history.

(56) References Cited

FOREIGN PATENT DOCUMENTS

| | | | | |
|---|---|---|---|---|
| CN | 112701757 A | | 4/2021 | |
| CN | 112816893 A | | 5/2021 | |
| CN | 114563712 A | | 5/2022 | |
| CN | 115946572 A | | 4/2023 | |
| WO | WO-2005007444 A1 | * | 1/2005 | ............ B60W 10/08 |

* cited by examiner

BATTERY MODULE CAPACITY CALCULATION AND POWER RECHARGE CONTROL METHODS, SYSTEMS, EQUIPMENT AND MEDIA

CROSS REFERENCES TO RELATED APPLICATIONS

This application claims the benefit of priority of Chinese patent application 202211461305.3, filed on Nov. 21, 2022, entitled "Battery Module Capacity Calculation and Power Recharge Control Methods, Systems, Devices and Media", the contents of which are incorporated herein by reference in its entirety.

TECHNICAL FIELD

The present disclosure relates to the technical field of battery management, and in particular to a method for capacity calculation, system, device and medium of a battery module.

BACKGROUND

Power batteries used in electric vehicles and energy storage batteries used in energy storage power stations have become popular on a large scale. To meet the capacity and power requirements of various scenarios, batteries are is connected in series or parallel to form a battery module to provide external capacity.

However, during usage, due to differences in manufacturing and operating conditions, the batteries may develop inconsistencies in capacity. This inconsistency can lead to voltage stratification in the individual batteries during the charging and discharging process. Following the principle of the "barrel effect", the total output of the battery module is determined by the battery with the lowest capacity. Therefore, after a certain period of use, it becomes necessary to recharge the battery module.

Current power stations do not take into account whether it is necessary to recharge the battery module, nor do they calculate the capacity of the battery module post-recharge. They also do not consider whether the capacity of the battery module has increased after the recharge and balancing operation. Instead, they directly recharge the battery module. The individual cells that are not fully charged are recharged using an external charging device until all cells meet the charge cut-off condition, thereby completing the recharge and balancing operation. In extreme cases, the recharging operation does not result in any increase in capacity, rendering the recharging operation ineffective.

SUMMARY

The technical problem to be solved by the present disclosure is that current technologies do not take into account whether it is necessary to recharge the battery module, nor do they calculate the capacity of the battery module post-recharge. They also do not consider whether the capacity of the battery module has increased after the recharge and balancing operation and whether the capacity is increasable. In light of this, battery module capacity calculation and power recharge control methods, systems, devices, and media are provided.

The present disclosure solves the above technical problem through the following technical solutions:

In a first embodiment, a method for capacity calculation of a battery module is provided. The method for calculating the capacity includes the following steps:

based on the historical charge and discharge parameters of each battery in the battery module, select the reference battery that meet the preset charge and discharge conditions from the battery module, and obtain the remaining battery in the battery module except the reference battery;

obtain the relative capacity of each remaining battery relative to the reference battery;

determine target capacities that meet preset capacity conditions based on the relative capacity of each remaining battery; and obtain the increasable capacity of the battery module based on the target capacities.

The increasable capacity is equal to a capacity that the battery module can discharge after the battery module performs the power recharge operation minus the capacity the battery module can discharge before the power replenishment operation.

Preferably, the step of selecting reference battery that meet preset charge and discharge conditions from the battery module based on the historical charge and discharge parameters of each battery in the battery module includes:

based on the historical charging and discharging parameters corresponding to each battery of the battery module, the battery in the battery module that reaches the charge cut-off first is used as the reference battery.

Preferably, the step of obtaining the relative capacity of each remaining battery relative to the reference battery includes.

based on the first historical charge and discharge parameters of the reference battery and the second historical charge and discharge parameters of each of the remaining batteries, obtain the chargeable capacity and the dischargeable capacity of each of the remaining batteries relative to the reference battery.

The relative capacity of each remaining battery relative to the reference battery is obtained based on the difference between the chargeable capacity and the dischargeable capacity corresponding to each remaining battery.

Preferably, based on the first historical charge and discharge parameters of the reference battery and the second historical charge and discharge parameters of each of the remaining batteries, the chargeable capacity of each of the remaining batteries relative to the reference battery is obtained. The steps include:

for any of the remaining batteries, obtain a corresponding charge cut-off voltage and charge cut-off time when the reference battery reaches the charge cut-off point;

obtain the charging voltage corresponding to the remaining battery at the charge cut-off time;

obtain the charge time when the reference battery reaches the charging voltage of the remaining battery; and obtain the charging current of the remaining battery between the charge time and the charge cut-off time.

The chargeable capacity of the remaining battery is calculated based on the charge time, the charge cut-off time, and the charging current corresponding to the remaining battery.

Preferably, based on the historical charge and discharge parameters of the reference battery and the historical charge and discharge parameters of each of the remaining batteries, the step of obtaining the dischargeable capacity of each of the remaining batteries relative to the reference battery includes:

for any of the remaining batteries, obtain the corresponding discharge cut-off voltage and discharge cut-off time when the remaining battery reaches the discharge cut-off point;

obtain the discharging voltage of the reference battery at the discharge cut-off time;

determine whether the discharge cut-off voltage of the remaining battery is greater than the discharging voltage of the reference battery; and if not, obtain the discharge time of the remaining battery when the remaining battery reaches the discharging voltage;

obtain the discharging current of the remaining battery between the discharge time and the discharge cut-off time; and based on the discharge time, the discharge cut-off time and the discharging current, the dischargeable capacity of the remaining battery is calculated.

Preferably, the step of selecting target capacities that meet preset capacity conditions based on the relative capacities includes:

obtain a capacity that satisfies a first preset capacity condition among the dischargeable capacities as the first capacity; and obtain a capacity that satisfies a second preset capacity condition among the relative capacities as the second capacity.

The step of obtaining the increasable capacity of the battery module based on the target capacities includes:

based on the first capacity and the second capacity, the increasable capacity of the battery module is calculated.

Preferably, the step of obtaining the capacity of the dischargeable capacity that satisfies the first preset capacity condition as the first capacity includes:

obtain the maximum value among the dischargeable capacities as the first capacity.

The step of obtaining the capacity that satisfies the second preset capacity condition among the relative capacities as the second capacity includes;

obtain the absolute value of the minimum value in the relative capacities as the second capacity.

The step of calculating the increasable capacity of the battery module based on the first capacity and the second capacity includes:

according to the difference between the first capacity and the second capacity, the increasable capacity of the battery module is obtained.

Preferably, the method for capacity calculation also includes:

obtain the initial dischargeable capacity of the battery module;

according to the sum of the increasable capacity and the initial dischargeable capacity of the battery module, the capacity that the battery module can additionally discharge after the battery module performs a recharging operation is obtained.

In a second embodiment, a method for power recharge control of a battery module is also provided. The method for power recharge control includes:

when it is determined that the battery module has a capacity that can be increased by using the above-mentioned method for capacity calculation, the battery module is controlled to be recharged;

when it is determined that the battery module does not have the increasable capacity, it is determined not to perform a power recharge operation on the battery module.

In a third embodiment, a system for capacity calculation of a battery module is also provided. The system for capacity calculation includes:

a battery acquisition module, used to select a reference battery that meet the preset charge and discharge conditions from the battery module based on the historical charge and discharge parameters of each battery in the battery module, and obtain the remaining batteries other than the reference battery;

a relative capacity acquisition module, configured to acquire a relative capacity of each remaining battery relative to the reference battery.

a target capacity acquisition module, used to determine target capacities that meet preset capacity conditions based on the relative capacities.

an increasable capacity acquisition module, configured to obtain an increasable capacity of the battery module based on the target capacities.

The increasable capacity is equal to a capacity that the battery module can discharge after the battery module performs the power recharge operation minus the one before the power recharge operation.

Preferably, the battery acquisition module is specifically configured to use the battery in the battery module that first reaches the charge cut-off as the reference battery based on the historical charge and discharge parameters corresponding to each battery in the battery module.

Preferably, the relative capacity acquisition module is specifically configured to obtain the capacity of each remaining battery relative to the first historical charge and discharge parameters of each of the remaining batteries based on the first historical charge and discharge parameters of the reference battery and the second historical charge and discharge parameters of each of the remaining batteries, to obtain the chargeable capacity and the dischargeable capacity of the reference battery, and to obtain the relative capacity of each remaining battery relative to the reference battery according to the difference between the chargeable capacity and the dischargeable capacity corresponding to each of the remaining batteries.

Preferably, the relative capacity acquisition module includes:

a chargeable capacity calculation unit, configured for obtaining, for each of the remaining batteries, a charge cut-off voltage and charge cut-off time when the reference battery reaches the charge cut-off; obtaining a charging voltage of said remaining battery at the charge cut-off time of the reference battery; obtaining a charge time when the reference battery reaches the charging voltage of said remaining battery; and obtaining a charging current of said remaining battery between the charge time and the charge cut-off time; wherein the chargeable capacity of said remaining battery is calculated based on the charge time, the charge cut-off time and the charging current of said remaining battery.

Preferably, the relative capacity acquisition module further includes:

a dischargeable capacity calculation unit, configured for obtaining a discharge cut-off voltage and discharge cut-off time for each of the remaining batteries, when said remaining battery reaches the discharge cut-off; obtaining a discharging voltage of the reference battery at the discharge cut-off time of said remaining battery;

determining whether the discharge cut-off voltage of said remaining battery is greater than the discharging voltage of the reference battery; if not, obtaining a discharge time of said remaining battery when said remaining batter reaches the discharging voltage; obtaining a discharging current of said remaining battery between the discharge time and the discharge cut-off time; and calculating the dischargeable capacity of said remaining battery, based on the discharge time, the discharge cut-off time and the discharging current of said remaining battery.

Preferably, the target capacity acquisition module is specifically configured to acquire the capacity of the dischargeable capacity that satisfies the first preset capacity condition as the first capacity; and acquire the capacity of the relative capacity that satisfies the second preset capacity condition as the second capacity.

The increasable capacity acquisition module is specifically configured to calculate the increased capacity of the battery module based on the first capacity and the second capacity.

Preferably, the system for capacity calculation also includes:

an initial capacity acquisition module, used to acquire an initial dischargeable capacity of the battery module; and a dischargeable capacity acquisition module, used to obtain the dischargeable capacity of the battery module after the battery module performs a recharging operation based on the sum of the increasable capacity and the initial dischargeable capacity of the battery module.

In a fourth embodiment, a system for power recharge control of a battery module is also provided. The power recharge control system includes:

a power recharge control module, used to control the power recharge operation of the battery module when it is determined that the battery module has a capacity that can be increased by using the above-mentioned battery module system for capacity calculation;

the power recharge control module is also configured to decide that it should not perform a power recharge operation on the battery module if it is determined that the battery module does not have the increasable capacity.

In a fifth embodiment, an electronic device is also provided, including a memory, a processor, and a computer program stored in the memory and executable on the processor. When the processor executes the computer program, the above-mentioned method for capacity calculation of a battery module or the above-mentioned method for power recharge control of a battery module is implemented.

In a sixth embodiment, a non-transitory computer-readable storage medium is also provided, on which a computer program is stored. When the computer program is executed by a processor, the above-mentioned method for capacity calculation of a battery module or the above-mentioned method for power recharge control of a battery module is implemented.

The positive advantageous effects of the present disclosure are the following.

The method for capacity calculation, system, device and medium of a battery module according to the present disclosure determine the reference battery and remaining batteries based on the historical charge and discharge parameters of each battery in the battery module, and calculate the relative capacity of each remaining battery related to the reference battery. Herein the increasable capacity of the battery module can be calculated, which is equal to a capacity which the battery module can discharge after the battery module performs a power recharge operation minus the capacity the battery module can discharge before the power recharge operation, so that the operation and maintenance personnel can know whether the battery module needs to be recharged, and whether the capacity of the battery module has increased after the recharge operation, and only control the capacity if there is an increasable capacity, which optimizes the power recharge process, improves power recharge efficiency, and improves power station operation and maintenance efficiency.

DETAILED DESCRIPTION OF THE PREFERRED EMBODIMENTS

The present disclosure is further described below by means of embodiments, but the present disclosure is not limited to the scope of the described embodiments.

Embodiment 1

Figure 1:
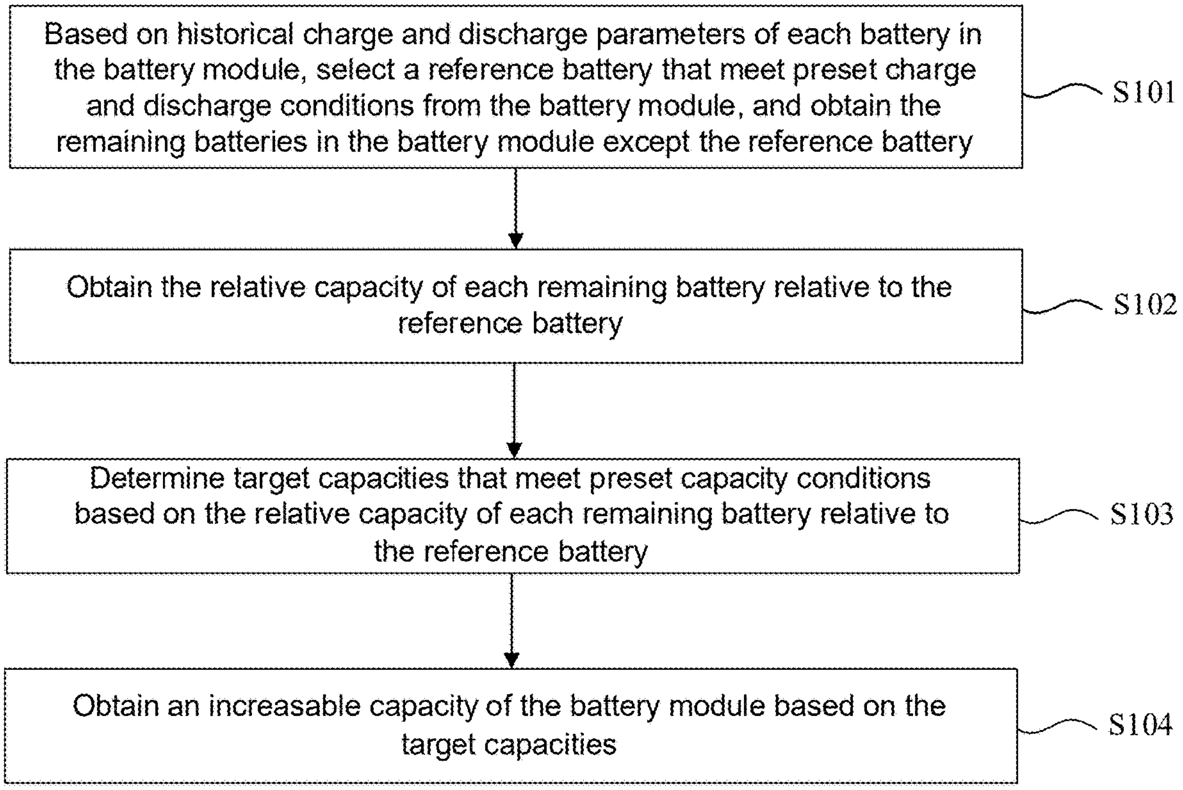
FIG. 1 is a first flow chart of a method for capacity calculation of a battery module provided according to Embodiment 1 of the present disclosure.

This embodiment provides a method for capacity calculation of a battery module. As shown in FIG. 1, the method for capacity calculation of a battery module includes step S101 to S104:

S101. based on historical charge and discharge parameters of each battery in the battery module, select a reference battery that meet preset charge and discharge conditions from the battery module, and obtain the remaining batteries in the battery module except the reference battery.

The historical charge and discharge parameters include battery recharge data in at least one complete charge and discharge cycle, such as charge and discharge time, charging and discharging current, charging and discharging voltages, etc.

The battery module is composed of several batteries. After being used for a period of time, the capacity of each battery will gradually become inconsistent. Therefore, it is necessary to select a reference battery based on the historical charge and discharge parameters of each battery as a basis for calculating capacity.

S102. obtain the relative capacity of each remaining battery relative to the reference battery.

Using the reference battery as a benchmark, obtain the relative capacity of each remaining battery relative to the reference battery.

S103. determine target capacities that meet preset capacity conditions based on the relative capacity of each remaining battery relative to the reference battery.

Each remaining battery has its own corresponding relative capacity, and the capacities that meets the preset capacity conditions are selected from the relative capacities as the target capacities.

S104. obtain an increasable capacity of the battery module based on the target capacities.

The increasable capacity is used to represent the additional capacity that the battery module can discharge after the battery module performs a recharge operation compared to the capacity before the recharge operation.

The power recharge operation in this embodiment can also be called power recharge equalization. Through the power recharge operation, the capacity deviation of individual batteries (aka, cells) in the battery module can be maintained within a preset range, so that after recharge, the battery module is improved and the capacity maximized.

The method for capacity calculation of the battery module in this embodiment determines the reference battery and the remaining batteries based on the historical charge and discharge parameters of each battery in the battery module, and calculates the relative capacity of each remaining battery relative to the reference battery, and then before the battery module is recharged, the increasable capacity of the battery module can be calculated, so that the operation and maintenance personnel can know whether the battery module needs to be recharged and whether the capacity of the battery module has been restored after the recharge operation, which improves power station operation and maintenance efficiency.

Figure 2:
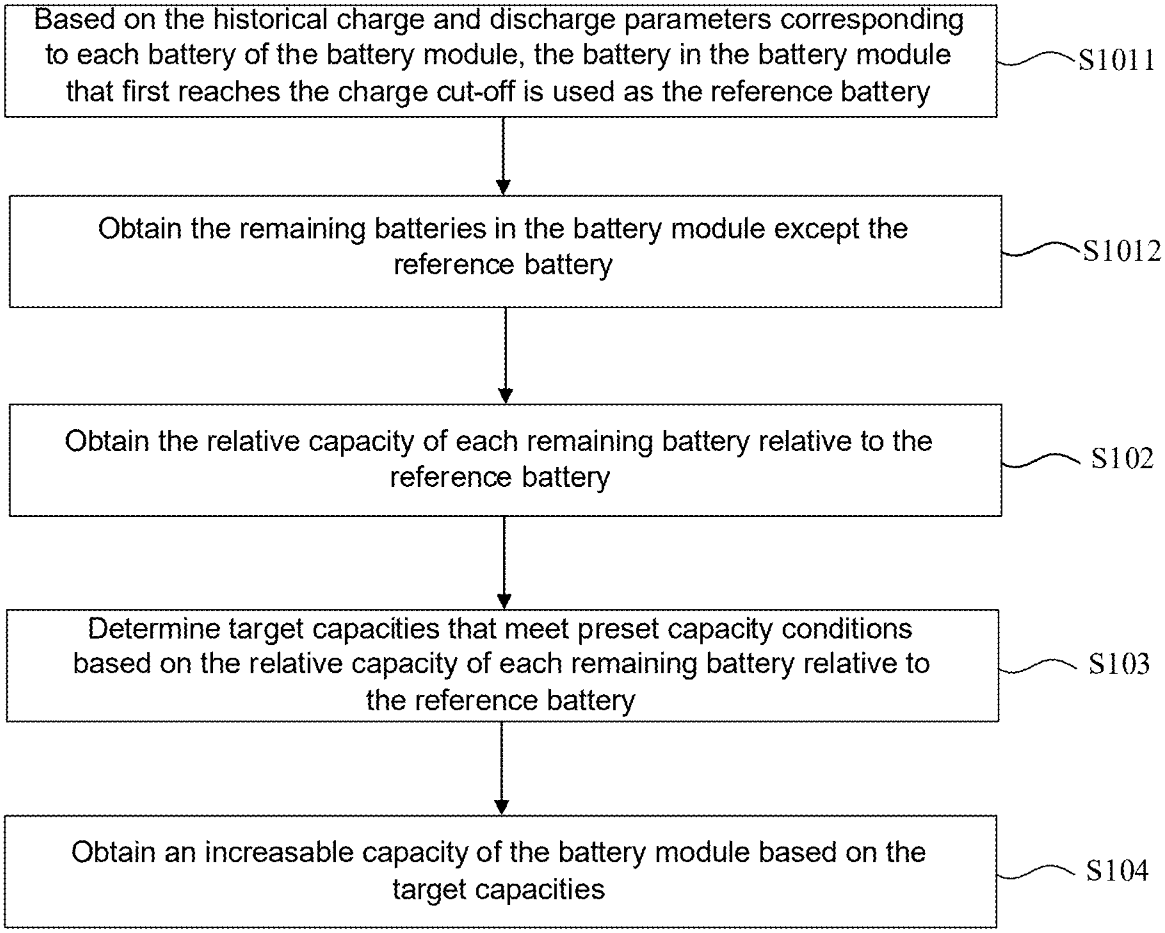
FIG. 2 is a second flow chart of the method for capacity calculation of the battery module provided according to Embodiment 1 of the present disclosure.

In an optional implementation, as shown in FIG. 2, the above step S101 includes the following steps S1011 and S1012.

S1011. based on the historical charge and discharge parameters corresponding to each battery of the battery module, the battery in the battery module that first reaches the charge cut-off is used as the reference battery.

S1012. obtain the remaining batteries in the battery module except the reference battery.

The preset charging and discharging conditions include reaching the charge cut-off first. Among the batteries in the battery module, the battery that reaches the charge cut-off first is the reference battery. After determining the reference battery, use the reference battery as the benchmark to obtain the relative capacity of each remaining battery relative to the reference battery.

The charge cut-off includes but is not limited to a fully charged state, for example, it may be a fully charged state, or it may be 90% of the fully charged state or other proportions of capacity.

The method for capacity calculation of the battery module in this embodiment is based on the historical charge and discharge parameters corresponding to each battery of the battery module, and accurately selects the reference battery from batteries in the battery module, thereby facilitating the use of the reference battery as the benchmark, obtain the relative capacity of each remaining battery relative to the reference battery, determine the target capacities that meet the preset capacity conditions based on the relative capacities, and then obtain the increasable capacity of the battery module based on the target capacities; it is convenient for operation and maintenance personnel to know if the battery module needs a power recharge operation, and whether the capacity of the battery module is increased after the power recharge operation, which improves the power station operation and maintenance efficiency.

Figure 3:
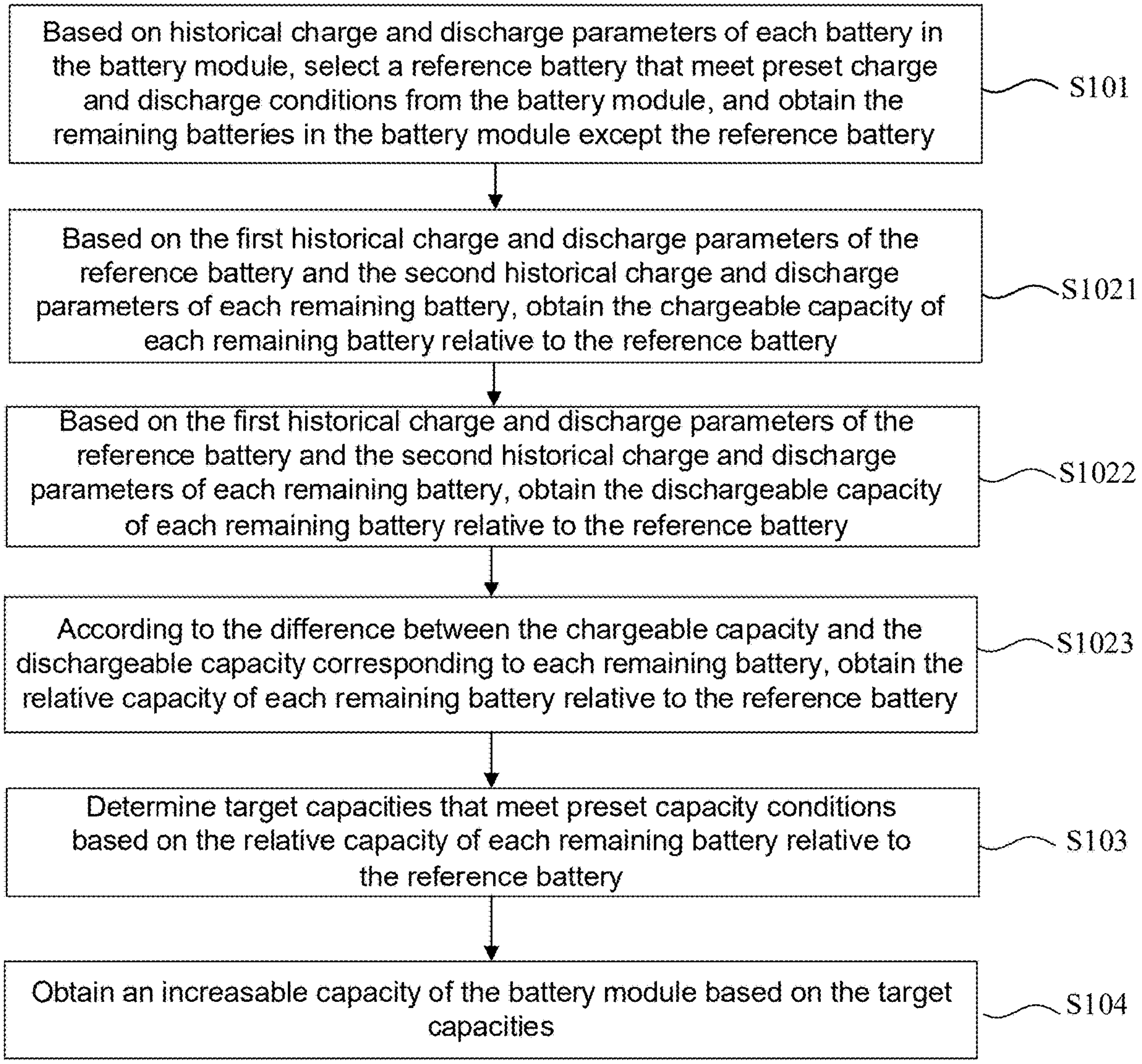
FIG. 3 is a third flow chart of the method for capacity calculation of the battery module provided according to Embodiment 1 of the present disclosure.

In an optional implementation, as shown in FIG. 3, the above step S102 includes steps S1021-S1023.

S1021. based on the first historical charge and discharge parameters of the reference battery and the second historical charge and discharge parameters of each remaining battery, obtain the chargeable capacity of each remaining battery relative to the reference battery.

S1022. based on the first historical charge and discharge parameters of the reference battery and the second historical charge and discharge parameters of each remaining battery, obtain the dischargeable capacity of each remaining battery relative to the reference battery.

S1023. according to the difference between the chargeable capacity and the dischargeable capacity corresponding to each remaining battery, obtain the relative capacity of each remaining battery relative to the reference battery.

In the method for capacity calculation of the battery module in this embodiment, as an example, the target capacities include one or more of the chargeable capacity and the dischargeable capacity, and is accurately calculated based on the first historical charge and discharge parameters of the reference battery and the second historical charge and discharge parameters of each remaining battery. The chargeable capacity and dischargeable capacity of each remaining battery relative to the reference battery are obtained, and then based on the difference between the chargeable capacity and dischargeable capacity corresponding to each remaining battery, the relative capacity of each remaining battery relative to the benchmark is obtained; and then the increasable capacity of the battery module is obtained based on the target capacities; it is convenient for operation and maintenance personnel to know whether the battery module needs to be recharged, and whether the capacity of the battery module has been improved after the recharge operation, which improves power station operation and maintenance efficiency.

In an optional implementation, the above step S1021 includes:

obtain, for each of the remaining batteries, a charge cut-off voltage and charge cut-off time when the reference battery reaches the charge cut-off;

obtain a charging voltage of said remaining battery at the charge cut-off time of the reference battery;

obtain a charge time when the reference battery reaches the charging voltage of said remaining battery;

obtain a charging current of said remaining battery between the charge time and the charge cut-off time; and calculate the chargeable capacity of said remaining battery based on the charge time, the charge cut-off time, and the charging current of said remaining battery.

Figure 4:
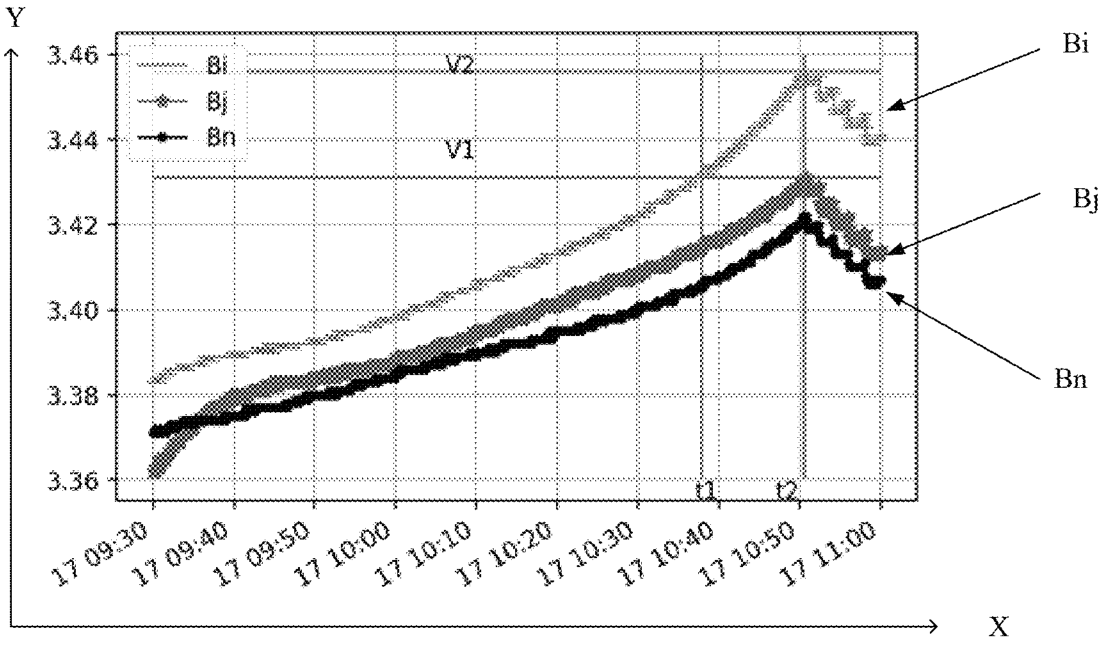
FIG. 4 is a first data diagram of historical charging and discharging parameters of the battery module provided according to Embodiment 1 of the present disclosure.

FIG. 4 is a first data diagram of the historical charge and discharge parameters of the battery module provided by this embodiment, corresponding to the charging process of the battery module; based on the first historical charge and discharge parameters of the reference battery and the second historical charge and discharge parameters of each remaining battery, the chargeable capacity of each remaining battery relative to the reference battery is calculated.

As shown in FIG. 4, battery Bi is the reference battery, battery Bj and battery Bn are two remaining batteries, V2 is the corresponding charge cut-off voltage when the reference battery Bi reaches the charge cut-off point, and t2 is the corresponding charge-off time when the reference battery Bi reaches the charge cut-off point; V1 is the charging voltage of the remaining battery Bj at the charge cut-off time t2, and t1 is the charge time when the reference battery Bi reaches the charging voltage V1.

It can be seen that, V1 is less than V2, then the chargeable capacity of the remaining battery Bj relative to the reference battery Bi is the current integral of the reference battery Bi from t1 to t2. That is, the formula for calculating the chargeable capacity of the remaining battery Bj is:

$$Qc = \int_{t1}^{t2} I dt \approx \sum_{k=1}^{n} \Delta t_k I_k.$$

Qc represents the chargeable capacity of the remaining battery, t1 represents the charge time, t2 represents the charge cut-off time, I represents the charging current, n indicates that the time interval between t1 and t2 is divided into n parts according to the sampling frequency, and $I_k$ represents the charging current corresponding to the k-th part, $\Delta t_k$ represents the time interval corresponding to the k-th part.

$I_k$ represents the charging current corresponding to the k-th part. The charging current may change during different charge time periods. The reference battery is used as the basis for calculation, and its chargeable capacity is 0.

According to the above formula for calculating the chargeable capacity, the chargeable capacity of the remaining battery Bj relative to the reference battery Bi is calculated.

In the same way, the chargeable capacity of other remaining batteries Bn relative to the reference battery Bi can be calculated. The charge time and charging voltage corresponding to different remaining batteries may be different, that is, n, $\Delta t_k$ and $I_k$ may be different. According to the second historical charge and discharge parameters of each remaining battery, they are calculated by the above chargeable capacity formula in combination with the above calculation.

The method for capacity calculation of the battery module in this embodiment accurately calculates the chargeable capacity of each remaining battery relative to the reference battery, and then based on the difference between the chargeable capacity and the dischargeable capacity corresponding to each remaining battery, the difference value is used to obtain the relative capacity of each remaining battery compared to the reference battery, and then obtain the increasable capacity of the battery module based on the target capacities; it is convenient for operation and maintenance personnel to know whether the battery module needs to be recharged and after the recharge operation, and whether the capacity of the battery module has been increased to improve the operation and maintenance efficiency of the power station.

In an optional implementation, the above step S1022 includes further steps:

for any remaining battery, obtain the corresponding discharge cut-off voltage and discharge cut-off time when the remaining battery reaches the discharge cut-off point;

obtain the discharging voltage of the reference battery at the discharge cut-off time of the remaining battery;

determine whether the discharge cut-off voltage of the remaining battery is greater than the discharging voltage of the reference battery;

if not, obtain the discharge time of the remaining battery when the remaining battery reaches the discharging voltage;

obtain the discharging current of the remaining battery between the discharge time and the discharge cut-off time;

based on the corresponding discharge time, discharge cut-off time and discharging current of the remaining battery, calculate the dischargeable capacity corresponding to the remaining battery.

Figure 5:
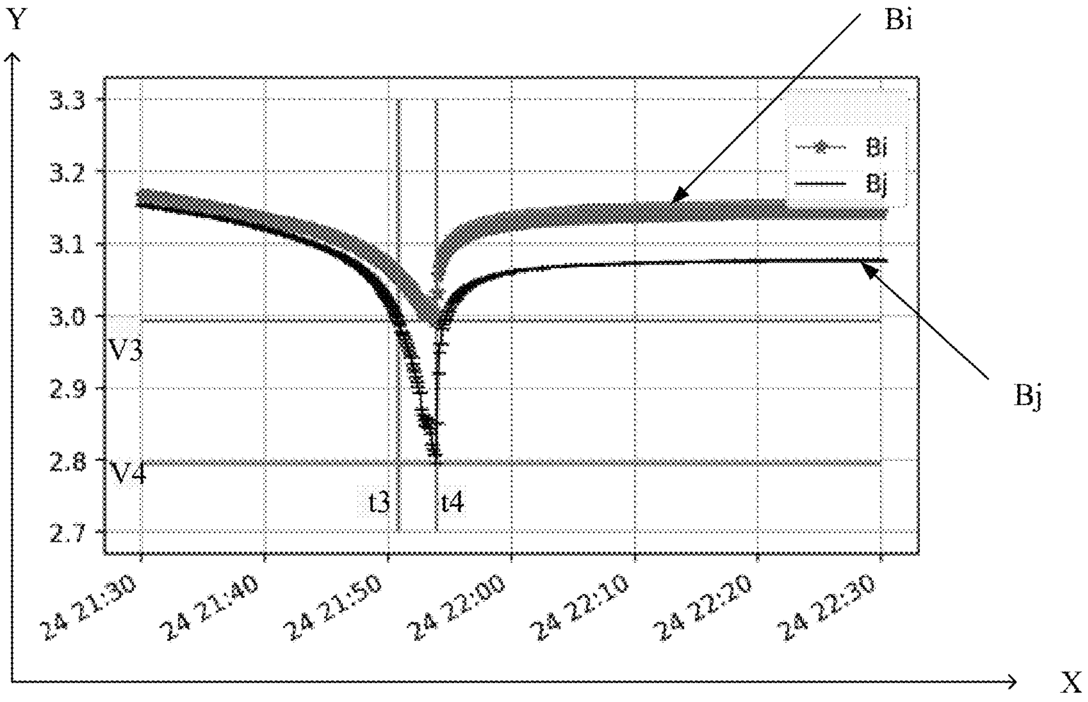
FIG. 5 is a second data diagram of the historical charging and discharging parameters of the battery module provided according to Embodiment 1 of the present disclosure.

FIG. 5 is a second data diagram of the historical charge and discharge parameters of the battery module provided by this embodiment, corresponding to the discharge process of the battery module; based on the first historical charge and discharge parameters of the reference battery and the second historical charge and discharge parameters of each remaining battery, calculate the dischargeable capacity of each remaining battery relative to the reference battery.

As shown in FIG. 5, battery Bi is the reference battery, battery Bj is one of the remaining batteries, V4 is the corresponding discharge cut-off voltage when the remaining battery Bj reaches the discharge cut-off point, and t4 is the corresponding discharge cut-off time when the remaining battery Bj reaches the discharge cut-off point; V3 is the discharging voltage of the reference battery Bi at the discharge cut-off time t4, and t3 is the discharge time when the remaining battery Bj reaches the discharging voltage V3.

If V4 is greater than V3, the dischargeable capacity of the remaining battery Bj relative to the reference battery Bi is 0.

If V4 is less than V3, the dischargeable capacity of the remaining battery Bj relative to the reference battery Bi is the current integral of the remaining battery Bj from t3 to t4. That is, the formula for calculating the dischargeable capacity of the remaining battery Bj is:

$$Qd = \int_{t3}^{t4} I' dt \approx \sum_{f=1}^{m} \Delta t_f I_f.$$

Qd represents the dischargeable capacity of the remaining battery, t3 represents the discharge time, t4 represents the discharge cut-off time, I' represents the discharging current, m indicates that the time interval between t3 and t4 is divided into m parts according to the sampling frequency, and $I_f$ represents the discharging current corresponding to the f-th part, $\Delta t_f$ represents the time interval corresponding to the f-th part.

$I_f$ represents the discharging current corresponding to the f-th part. In different discharge time periods, the discharging current may change.

Based on the above formula for calculating the dischargeable capacity, the dischargeable capacity of the remaining battery Bj relative to the reference battery Bi is calculated.

In the same way, the dischargeable capacity of other remaining batteries relative to the reference battery Bi can be calculated. The discharge time and discharging voltage corresponding to different remaining batteries may be different, that is, m, $\Delta t_f$ and $I_f$ may be different. According to the second historical charging and discharging parameters of each remaining battery, the dischargeable capacity of each remaining battery is calculated based on the above formula.

The method for capacity calculation of the battery module in this embodiment accurately calculates the dischargeable capacity of each remaining battery relative to the reference battery, and then based on the difference between the chargeable capacity and the dischargeable capacity of each remaining battery value, obtain the relative capacity of each remaining battery relative to the reference battery, and then obtain the increasable capacity of the battery module based on the target capacities; it is convenient for operation and maintenance personnel to know whether the battery module needs to be recharged, and the battery after the recharge operation, whether the module capacity has been increased and the power station operation and maintenance efficiency has been improved.

Figure 6:
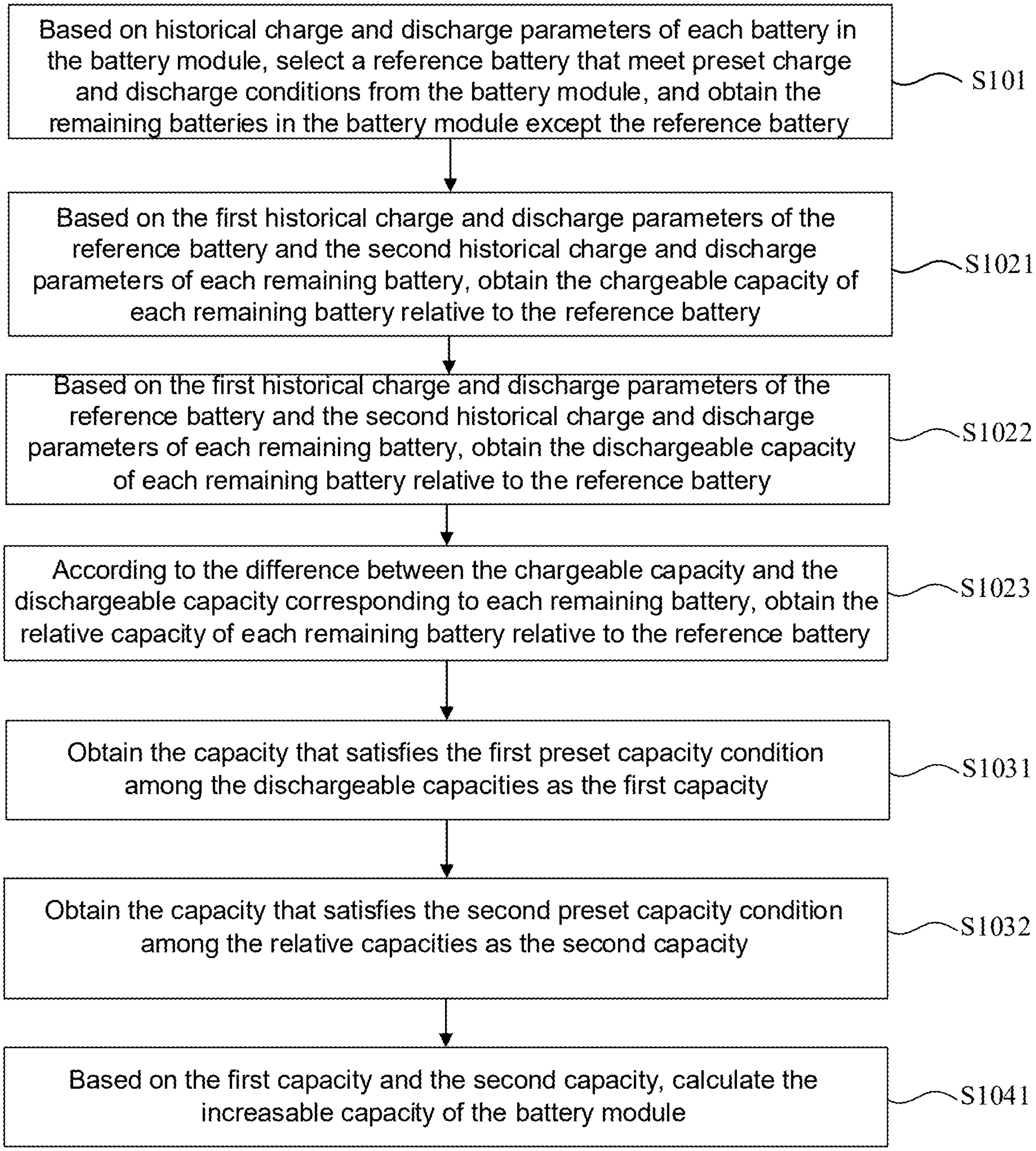
FIG. 6 is a fourth flowchart of the method for capacity calculation of the battery module provided according to Embodiment 1 of the present disclosure.

In an optional implementation, as shown in FIG. 6, the above step S103 includes further steps:

S1031. obtain the capacity that satisfies the first preset capacity condition among the dischargeable capacities as the first capacity.

Qd represents the dischargeable capacity of one of the remaining batteries. If there are s remaining batteries in the battery module, the dischargeable capacity of the first remaining battery can be expressed as Qd1, the dischargeable capacity of the second remaining battery can be expressed as Qd2, and the s-th dischargeable capacity of the remaining batteries can be expressed as Qds, then the dischargeable capacity of all remaining batteries can be expressed as (Qd1, Qd2, . . . , Qds). From (Qd1, Qd2, . . . , Qds), select the one that satisfies the first preset capacity as the first capacity Qd-t.

S1032. obtain the capacity that satisfies the second preset capacity condition among the relative capacities as the second capacity.

The relative capacity of a certain remaining battery is the difference between the corresponding chargeable capacity and the dischargeable capacity of the remaining battery. Qc represents the chargeable capacity of the remaining battery, Qd represents the dischargeable capacity of the remaining battery, Qr represents the relative capacity of the remaining battery, then Qr=Qc−Qd.

When Qr is a positive number, it means that the capacity of the remaining battery is greater than the capacity of the reference battery. When Qr is a negative number, it means that the capacity of the remaining battery is less than the capacity of the reference battery.

The chargeable capacity of the first remaining battery can be expressed as Qc1, the chargeable capacity of the second remaining battery can be expressed as Qc2, and the chargeable capacity of the s-th remaining battery can be expressed as Qcs.

Then the relative capacity of the first remaining battery can be expressed as Qr1, Qr1=Qc1−Qd1, the relative capacity of the second remaining battery can be expressed as Qr2, Qr2=Qc2−Qd2, and the relative capacity of the s-th remaining battery can be expressed as Qrs, Qrs=Qcs−Qds; then the relative capacity of all remaining batteries can be expressed as (Qr1, Qr2, . . . , Qrs), and the one that meets the second preset capacity condition is selected from (Qr1, Qr2, . . . , Qrs) as the second capacity Qr-t.

The above step S104 includes further steps:

S1041. based on the first capacity and the second capacity, calculate the increasable capacity of the battery module.

According to the first capacity Qd-t and the second capacity Qr-t, the increasable capacity Qp of the battery module is calculated.

The method for capacity calculation of the battery module in this embodiment is to select the capacity that satisfies the first preset capacity condition from the dischargeable capacities as the first capacity, and selects the capacity that satisfies the second preset capacity condition from the relative capacities as the second capacity, based on the first capacity and the second capacity, the increasable capacity of the battery module is accurately calculated; it is convenient for operation and maintenance personnel to know whether the battery module needs to be recharged, and the battery after the recharge operation, whether the module capacity has been increased and the power station operation and maintenance efficiency has been improved.

Figure 7:
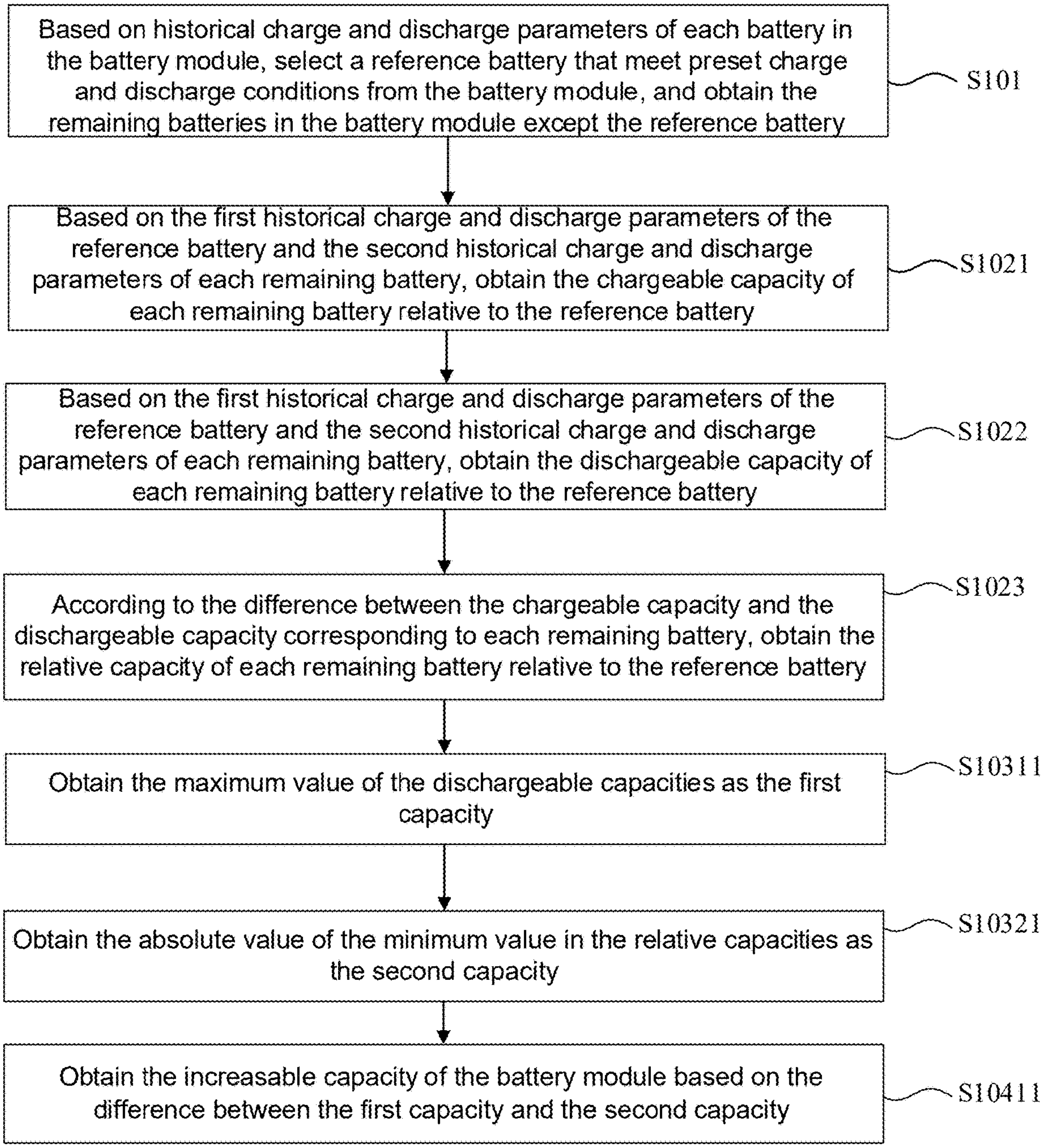
FIG. 7 is a fifth flow chart of the method for capacity calculation of the battery module provided according to Embodiment 1 of the present disclosure.

In an optional implementation, as shown in FIG. 7, the above step S1031 includes the further steps:

S10311. obtain the maximum value of the dischargeable capacities as the first capacity.

The above step S1032 includes the following steps:

S10321. obtain the absolute value of the minimum value in the relative capacities as the second capacity.

The above step S1041 includes further steps:

S10411. obtain the increasable capacity of the battery module based on the difference between the first capacity and the second capacity.

obtain the maximum value of all dischargeable capacities (Qd1, Qd2, . . . , Qds) as the first capacity Qd-t, that is, Qd-t=max (Qd1, Qd2, . . . , Qds).

obtain the absolute value of the minimum value among all relative capacities (Qr1, Qr2, . . . , Qrs) as the second capacity Qr-t, that is, Qr-t=abs (min (Qr1, Qr2, . . . , Qrs)). Usually, the minimum value of the relative capacity is a negative number.

Theoretically, if the capacities of all remaining batteries are exactly the same, then after recharging, the battery module's increasable capacity will be the maximum value among the dischargeable capacities, that is, the first capacity Qd-t.

In fact, since the capacities of the remaining batteries are usually inconsistent, the battery with the smallest relative capacity ends discharging first. In this case, the theoretically increasable capacity is reduced by the absolute value of the smallest value of the relative capacities, that is, a capacity loss of Qr-t occurred. If the capacity of each remaining battery is exactly the same, Qr-t is 0, and therefore the capacity loss is 0.

Therefore, the increasable capacity Qp is the difference between the first capacity Qd-t and the second capacity Qr-t, that is, Qp=Qd-t−Qr-t.

The method for capacity calculation of the battery module in this embodiment obtains the maximum value of the dischargeable capacities as the first capacity, and obtains the absolute value of the minimum value of the relative capacities as the second capacity. According to the first capacity and the second capacity, the capacity difference can be accurately calculated to obtain the increasable capacity of the battery module, which facilitates operation and maintenance personnel to know whether the battery module needs to be recharged and whether the capacity of the battery module has been improved after the recharge operation, thereby improving the operation and maintenance efficiency of the power station.

Figure 8:
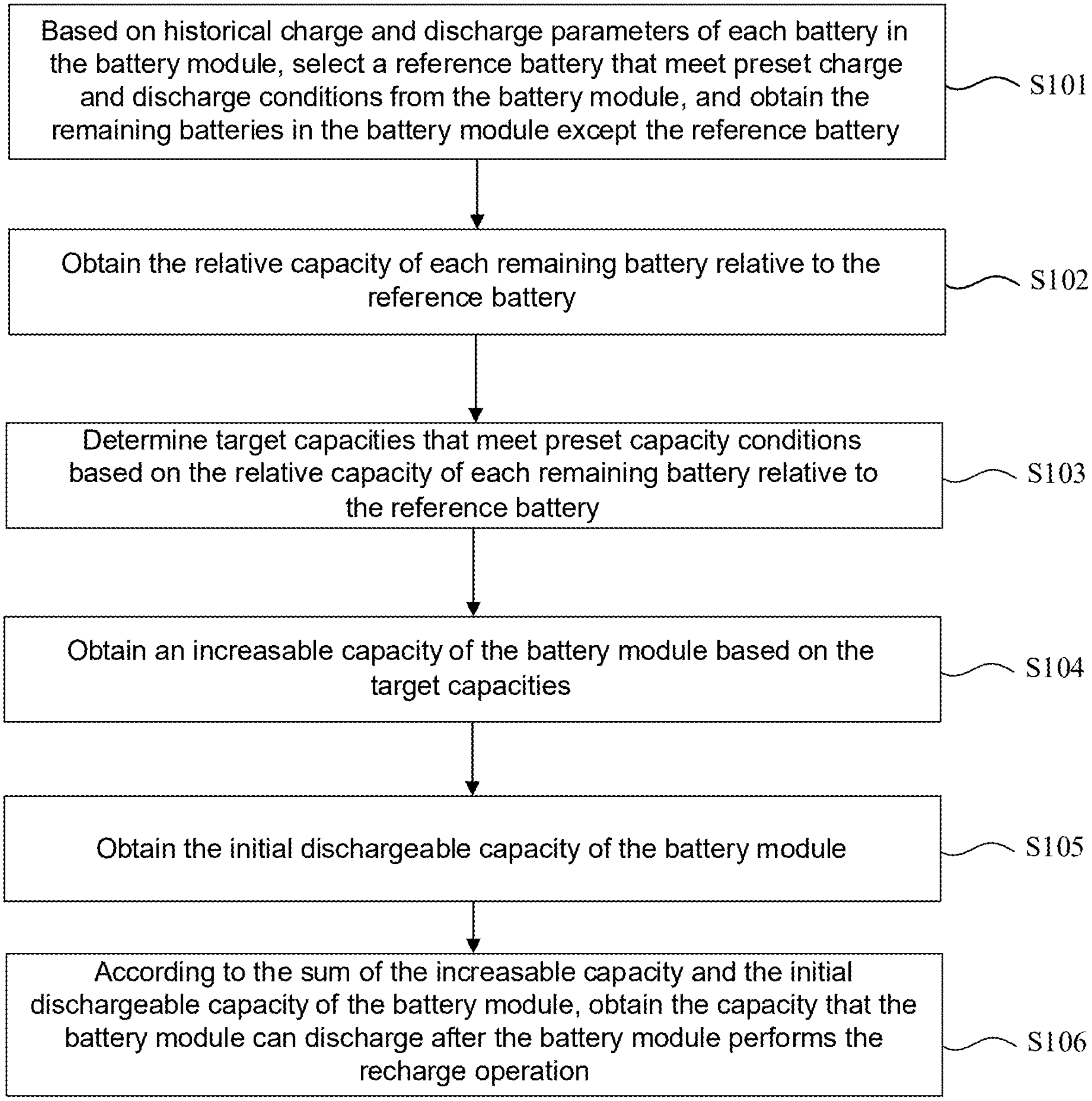
FIG. 8 is a sixth flow chart of the method for capacity calculation of the battery module provided according to Embodiment 1 of the present disclosure.

In an optional implementation, as shown in FIG. 8, the method for capacity calculation further includes the steps S105 and S106:

S105. obtain the initial dischargeable capacity of the battery module.

According to the recorded data of the power station, the initial dischargeable capacity Qi of the battery module can be known, or based on the historical charge and discharge parameters of the battery module, the initial dischargeable capacity of the battery module can be calculated. The initial dischargeable capacity is the battery module's recharge capacity that can be released before the recharge operation.

S106. According to the sum of the increasable capacity and the initial dischargeable capacity of the battery module, obtain the capacity that the battery module can discharge after the battery module performs the recharge operation.

According to the sum of the initial dischargeable capacity Qi and the increasable capacity Qp of the battery module, the capacity Qm that can be released by the battery module after the battery module is recharged is obtained, that is, Qm=Qi+Qp.

For example, the rated capacity of the battery module is 120 AH (ampere hour, a unit of capacity). After a period of use, the capacity of the battery module will decrease, and a recharge operation is required. The initial dischargeable capacity before the recharge operation (that is, the existing capacity) is 80 AH. If the battery module's increasable capacity is calculated to be 20 AH, then after the battery module performs a recharge operation, the capacity that the battery module can discharge is 100 AH, more than the initial dischargeable capacity.

The method for capacity calculation of the battery module in this embodiment is based on the sum of the initial dischargeable capacity and the increasable capacity of the battery module to obtain the capacity that the battery module can discharge after the battery module performs a recharge operation, which is convenient for operation and maintenance personnel. Knowing whether the battery module needs to be recharged and whether the capacity of the battery module has been improved after the recharge operation improves the efficiency of power station operation and maintenance.

Embodiment 2

Figure 9:
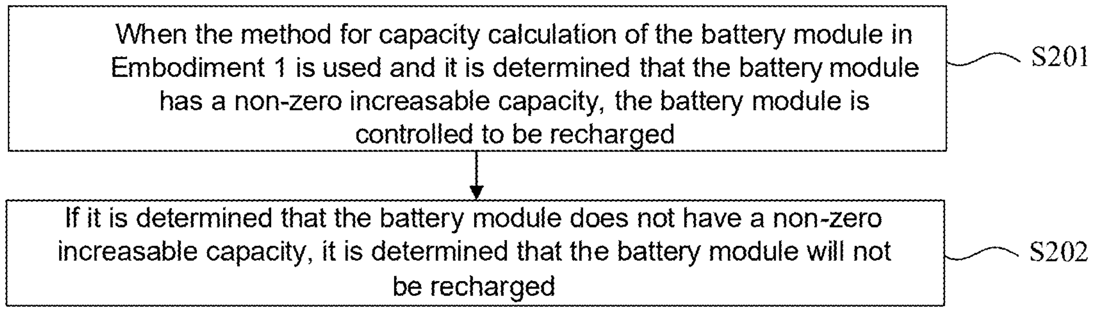
FIG. 9 is a flow chart of a method for power recharge control of a battery module provided according to Embodiment 2 of the present disclosure.

This embodiment provides a method for power recharge control of a battery module. As shown in FIG. 9, the method for power recharge control of a battery module includes the following.

S201. When the method for capacity calculation of the battery module in Embodiment 1 is used and it is determined that the battery module has a non-zero increasable capacity, the battery module is controlled to be recharged.

S202. If it is determined that the battery module does not have a non-zero increasable capacity, it is determined that the battery module will not be recharged.

If the battery module has a non-zero increasable capacity, it is necessary and meaningful to recharge the battery module to increase the capacity of the battery module; if the battery module does not have a non-zero increasable capacity, the recharge operation is unnecessary and meaningless, in which case even if the battery module is recharged, the capacity of the battery module cannot be improved.

The method for power recharge control of the battery module in this embodiment uses the method for capacity calculation of the battery module in Embodiment 1 to calculate the increasable capacity of the battery module, and then determines whether the battery module has an increasable capacity. If yes, control the recharge operation for the battery module. If not, it is determined not to perform the recharge operation for the battery module. This will make it easier for operation and maintenance personnel to know whether it is necessary to perform a power recharge operation, and whether the capacity of the battery module has been increased after the power recharge operation. Only when the capacity can be increased, the recharge operation of the battery module is controlled, optimizing the power recharge process, and improving power recharge efficiency and power station operation and maintenance efficiency.

Embodiment 3

Figure 10:
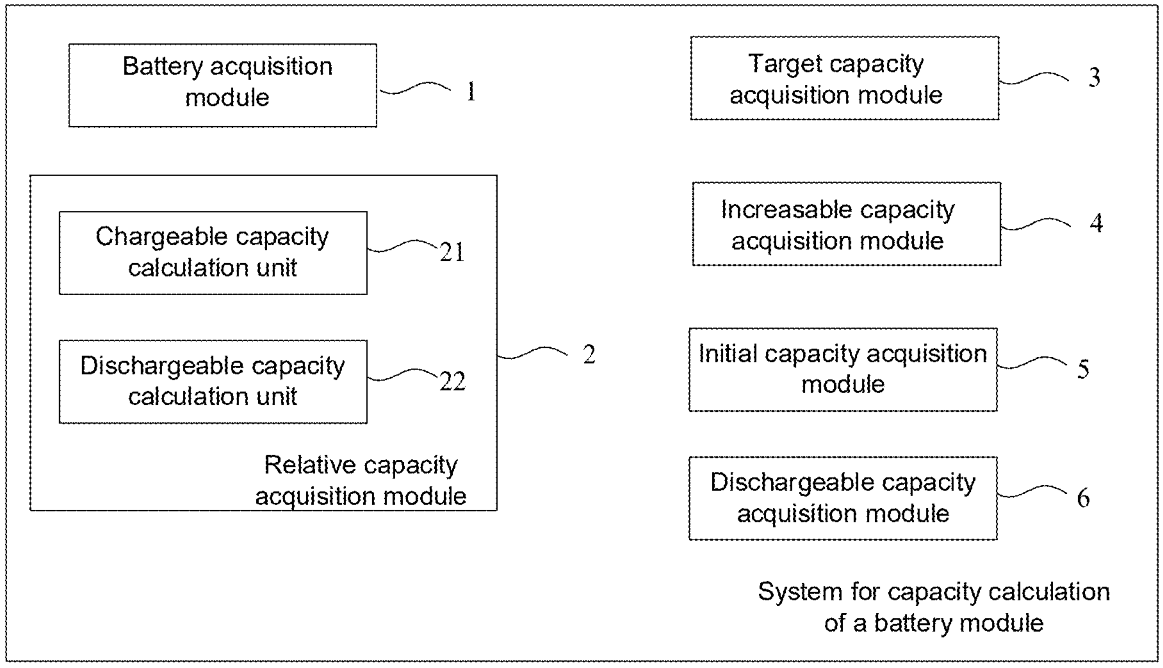
FIG. 10 is a schematic block structural diagram of a system for capacity calculation of a battery module provided according to Embodiment 3 of the present disclosure.

This embodiment provides a system for capacity calculation of a battery module. As shown in FIG. 10, the system for capacity calculation of a battery module includes a battery acquisition module 1, which is used to obtain the data based on the historical charge and discharge parameters of each battery in the battery module, select the reference battery that meet the preset charging and discharging conditions from the battery module, and obtain the remaining batteries in the battery module except the reference battery; the relative capacity acquisition module 2 is used to obtain the relative capacity of each remaining battery relative to the reference battery. capacity; the target capacity acquisition module 3 is used to determine the target capacities that meet the preset capacity conditions based on the relative capacities; the increasable capacity acquisition module 4 is used to obtain the increasable capacity of the battery module based on the target capacities; wherein the increasable capacity is equal to the capacity that the battery module can discharge after the battery module performs the recharge operation minus the capacity before the recharge operation.

In an optional implementation, the battery acquisition module 1 is specifically configured to use the battery in the battery module that first reaches the charge cut-off as the reference battery based on the historical charge and discharge parameters corresponding to each battery in the battery module.

In an optional implementation, the relative capacity acquisition module 2 is specifically configured to obtain the relative capacity of each remaining battery relative to the reference battery based on the first historical charge and discharge parameters of the reference battery and the second historical charge and discharge parameters of each remaining battery. According to the difference between the chargeable capacity and the dischargeable capacity of each remaining battery, the relative capacity of each remaining battery relative to the reference battery is obtained.

In an optional embodiment, the relative capacity acquisition module 2 includes a chargeable capacity calculation unit 21, which is used to obtain, for any remaining battery, the corresponding charge cut-off voltage and charge cut-off time when the reference battery reaches the charge cut-off point; obtain the charging voltage corresponding to the charge cut-off time of the remaining battery; obtain the charge time corresponding to the charging voltage of the reference battery; obtain the charging current between the charge time and the charge cut-off time of the remaining battery; based on the charge time and charge cut-off time corresponding to the remaining battery and charging current, calculate the corresponding chargeable capacity of the remaining battery.

In an optional embodiment, the relative capacity acquisition module 2 includes a dischargeable capacity calculation unit 22, which is used to obtain, for any remaining battery, the corresponding discharge cut-off voltage and discharge cut-off time when the remaining battery reaches the discharge cut-off point; obtain the discharging voltage of the reference battery at the discharge cut-off time; determine whether the discharge cut-off voltage of the remaining battery is greater than the discharging voltage of the reference battery; if not, obtain the discharge time corresponding to the discharging voltage of the remaining battery; obtain the discharge time and discharge cut-off time of the remaining battery. Based on the corresponding discharge time, discharge cut-off time and discharging current of the remaining battery, the dischargeable capacity corresponding to the remaining battery is calculated.

In an optional implementation, the target capacity acquisition module 3 is specifically configured to select a dischargeable capacity that satisfies the first preset capacity condition as the first capacity; and acquire a relative capacity that satisfies the second preset capacity condition as the second capacity. The increasable capacity acquisition module 4 is specifically configured to calculate the increasable capacity of the battery module based on the first capacity and the second capacity.

In an optional implementation, the system for capacity calculation also includes an initial capacity acquisition module 5 for acquiring the initial dischargeable capacity of the battery module; a dischargeable capacity acquisition module 6 for determining the increasable capacity and initial capacity of the battery module. The sum of the increasable capacity and the initial dischargeable capacity of the battery module is the capacity that the battery module can discharge after the battery module performs a recharge operation.

The working principle of the system for capacity calculation of a battery module in this embodiment is the same as the working principle of the method for capacity calculation of the battery module in Embodiment 1, and will not be described in detail here.

The system for capacity calculation of a battery module in this embodiment determines the reference battery and the remaining batteries based on the historical charge and discharge parameters of each battery in the battery module, and calculates the relative capacity of each remaining battery relative to the reference battery, and then before the battery module is recharged, the increasable capacity of the battery module can be calculated; it is convenient for operation and maintenance personnel to know if the battery module needs a power recharge operation, and whether the capacity of the battery module is increased after the power recharge operation, which improves the power station operation and maintenance efficiency.

Embodiment 4

Figure 11:
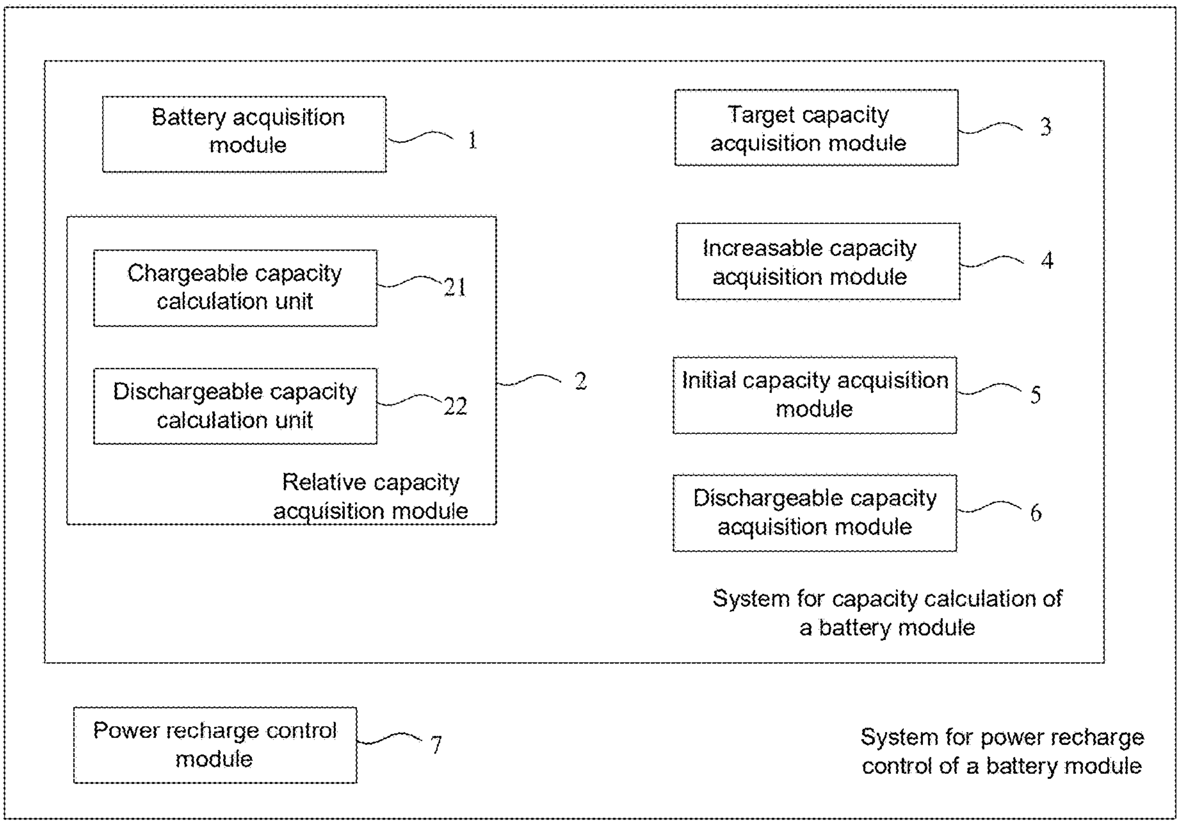
FIG. 11 is a schematic block structural diagram of a system for power recharge control of a battery module provided according to Embodiment 4 of the present disclosure.

This embodiment provides a system for power recharge control of a battery module. As shown in FIG. 11, the system for power recharge control of a battery module includes a power recharge control module 7, which may cooperate with the system for capacity calculation of a battery module in Embodiment 3. when it is determined that the battery module has a non-zero increasable capacity by applying the method for capacity calculation of the battery module, the power recharge operation of the battery module is performed; and when it is determined that the battery module does not have a non-zero increasable capacity, the power recharge operation of the battery module is not performed.

If the battery module has a non-zero increasable capacity, it is necessary and meaningful to recharge the battery module to increase the capacity of the battery module; if the battery module does not have a non-zero increasable capacity, the recharge operation is unnecessary and meaningless, in which case even if the battery module is recharged, the capacity of the battery module cannot be improved.

The system for power recharge control of a battery module in this embodiment uses the system for capacity calculation of a battery module in Embodiment 3 to calculate the increasable capacity of the battery module, and then determines whether the battery module has a non-zero increasable capacity. If yes, control the recharge operation for the battery module. If not, it is determined not to perform the recharge operation for the battery module; This will make it easier for operation and maintenance personnel to know whether it is necessary to perform a power recharge operation, and whether the capacity of the battery module has been increased after the power recharge operation. Only when the capacity can be increased, the recharge operation of the battery module is controlled, optimizing the power recharge process, and improving power recharge efficiency and power station operation and maintenance efficiency.

Embodiment 5

Figure 12:
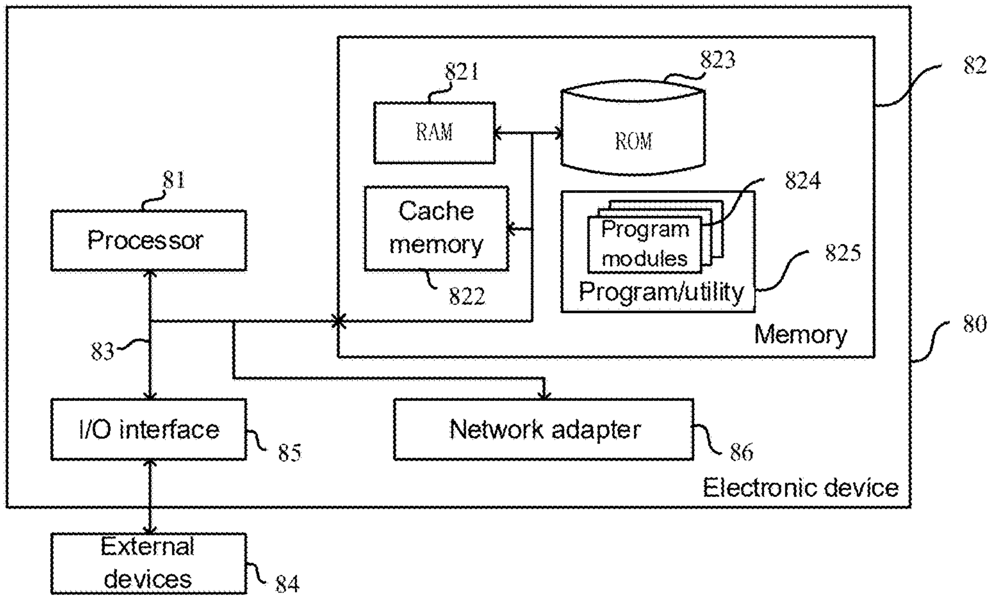
FIG. 12 is a schematic block structural diagram of an electronic device provided according to Embodiment 5 of the present disclosure.

This embodiment provides an electronic device. FIG. 12 is a schematic structural diagram of the electronic device provided in this embodiment. The electronic device includes a memory, a processor, and a computer program stored in the memory and executable on the processor. When the processor executes the program, it implements the method for capacity calculation of a battery module in Embodiment 1, or the method for power charge control of a battery module in Embodiment 2. The electronic device 80 shown in FIG. 12 is only an example and should not bring any limitations to the functions and scope of use of the embodiments of the present disclosure.

As shown in FIG. 12, the electronic device 80 may be in the form of a general computing device, which may be a server device, for example. The components of the electronic device 80 may include, but are not limited to: the above-mentioned at least one processor 81, the above-mentioned at least one memory 82, and a bus 83 connecting different system components (including the memory 82 and the processor 81).

The bus 83 includes a data bus, an address bus, and a control bus.

The memory 82 may include volatile memory, such as random-access memory (RAM) 821 and/or cache memory 822, and may further include read only memory (ROM) 823.

The memory 82 may also include a program/utility 825 having a set of (at least one) program modules 824 including, but not limited to: an operating system, one or more application programs, other program modules, and program data. Each of the examples, or some combination thereof, may include the implementation of a network environment.

The processor 81 executes computer programs stored in the memory 82 to perform various functional applications and data processing, such as the method for capacity calculation of the battery module in Embodiment 1 of the present disclosure, or the battery module in Embodiment 2. Power supply control method.

The electronic device 80 may also communicate with one or more external devices 84 (e.g., keyboard, pointing device, etc.). This communication may occur through the input/output (I/O) interface 85. Furthermore, the model generation device 80 may also communicate with one or more networks (e.g., a local area network (LAN), a wide area network (WAN), and/or a public network, such as the Internet) through a network adapter 86. As shown in FIG. 12, network adapter 86 communicates with other modules of model-generated device 80 via bus 83. It should be understood that, although not shown in the figures, other hardware and/or software modules may be used in conjunction with the model-generated device 80, including but not limited to: microcode, device drivers, redundant processors, external disk drive arrays, RAID (disk Array) systems, tape drives, and data backup storage systems, etc.

It should be noted that although several units/modules or sub-units/modules of the electronic device are mentioned in the above detailed description, this division is only exemplary and not mandatory. Indeed, according to embodiments of the present disclosure, the features and functions of two or more units/modules described above may be embodied in one unit/module. Conversely, the features and functions of one unit/module described above may be further divided to be embodied by multiple units/modules.

Embodiment 6

This embodiment provides a non-transitory computer-readable storage medium on which a computer program is stored. When the program is executed by a processor, the steps in the method for capacity calculation of a battery module in Embodiment 1 are implemented, or steps of the method for power charge control of a battery module in Embodiment 2 are implemented.

Among them, the readable storage medium that can be used may more specifically include but is not limited to: portable disk, hard disk, random access memory, read-only memory, erasable programmable read-only memory, optical storage device, magnetic storage device or any of the above.

In a possible implementation, the present disclosure can also be implemented in the form of a program product, which includes program code. When the program product is executed on a terminal device, the program code is used to cause the terminal device to execute the steps in the method for capacity calculation of a battery module in Embodiment 1 or the steps of the method for power charge control of a battery module in Embodiment 2.

Among them, the program code for executing the present disclosure can be written in any combination of one or more programming languages. The program code can be completely executed on the user device, partially executed on the user device, as an independent software package which executes, partially on the user device and partially on the remote device, or entirely on the remote device.

Although specific embodiments of the present disclosure have been described above, those skilled in the art will understand that these are only examples, and the protection scope of the present disclosure is defined by the appended claims. Those skilled in the art can make various changes or modifications to these examples without departing from the principles and essence of the present disclosure, but these changes and modifications all fall within the protection scope of the present disclosure.

The invention claimed is:

1. A method for capacity calculation of a battery module, comprising:

selecting a reference battery from the battery module based on historical charge and discharge parameters of each battery in the battery module, wherein the reference battery meets preset charge and discharge conditions, and acquiring remaining batteries from the battery module except the reference battery;

obtaining a relative capacity of each of the remaining batteries relative to the reference battery, wherein obtaining the relative capacity of each of the remaining batteries relative to the reference battery comprises: obtaining, based on first historical charge and discharge parameters of the reference battery and second historical charge and discharge parameters of each of the remaining batteries, a chargeable capacity and a dischargeable capacity of each of the remaining batteries relative to the reference battery; and obtaining the relative capacity of each of the remaining batteries relative to the reference battery based on a difference between the chargeable capacity and the dischargeable capacity corresponding to each of the remaining batteries;

determining a target capacity which meets a preset capacity condition selected as the relative capacity of said remaining battery compared to the reference battery, wherein determining the target capacity which meets a preset capacity condition selected as the relative capacity of said remaining battery compared to the reference battery comprises: obtaining, among the dischargeable capacities, a capacity satisfying a first preset capacity condition as a first capacity; and obtaining, among the relative capacities, a capacity satisfying a second preset capacity condition as a second capacity; and obtaining an increasable capacity of the battery module based on the target capacity, wherein obtaining the increasable capacity of the battery module based on the target capacity comprises: calculating the increasable capacity of the battery module based on the first capacity and the second capacity;

wherein the increasable capacity of the battery module represents a capacity which the battery module can release after the battery module performs a power replenishment operation compared to the capacity the battery module can release before the power replenishment operation.

2. The method according to claim 1, wherein selecting the reference battery from the battery module based on historical charge and discharge parameters of each battery in the battery module further comprises a step of choosing the reference battery which is a first to reach a charging cut-off.

3. The method according to claim 1, wherein obtaining a chargeable capacity and a dischargeable capacity of each of the remaining batteries relative to the reference battery based on first historical charge and discharge parameters of the reference battery and second historical charge and discharge parameters of each of the remaining batteries further comprises:

obtaining, for each of the remaining batteries, a charge cut-off voltage and charge cut-off time when the reference battery reaches the charge cut-off;

obtaining a charging voltage of said remaining battery at the charge cut-off time of the reference battery;

obtaining a charge time when the reference battery reaches the charging voltage of said remaining battery; and obtaining a charging current of said remaining battery between the charge time and the charge cut-off time;

wherein the chargeable capacity of said remaining battery is calculated based on the charging time, the charging cut-off time, and the charging current of said remaining battery.

4. The method according to claim 1, wherein obtaining a chargeable capacity and a dischargeable capacity of each of the remaining batteries relative to the reference battery based on first historical charge and discharge parameters of the reference battery and second historical charge and discharge parameters of each of the remaining batteries further comprises:

obtaining a discharge cut-off voltage and discharge cut-off time for each of the remaining batteries, when said remaining battery reaches the discharge cut-off;

obtaining a discharging voltage of the reference battery at the discharge cut-off time of said remaining battery;

determining whether the discharge cut-off voltage of said remaining battery is greater than the discharging voltage of the reference battery;

if not, obtaining a discharge time of said remaining battery when said remaining batter reaches the discharging voltage;

obtaining a discharging current of said remaining battery between the discharge time and the discharge cut-off time; and calculating the dischargeable capacity of said remaining battery, based on the discharge time, the discharge cut-off time and the discharging current of said remaining battery.

5. The method according to claim 1, wherein determining the target capacity which meets the preset capacity condition selected as the relative capacity of caid remaining battery compared to the reference battery of said remaining battery further comprises:

obtaining a first capacity which meets a first preset capacity condition among the dischargeable capacities of the remaining batteries; and defining the maximum value as the first capacity;

obtaining a second capacity which meets the second preset capacity condition among the relative capacities of the remaining batteries;

wherein obtaining the increased capacity of the battery module based on the target capacity comprises:

calculating the increasable capacity of the battery module based on the first capacity and the second capacity.

6. The method according to claim 1, wherein the method further comprises:

obtaining an initial discharge capacity of the battery module; and obtaining a dischargeable capacity of the battery module after the battery module performs a recharging operation as a sum of the increasable capacity and the initial discharge capacity of the battery module.

7. A method for power replenishment control of a battery module, comprising:

applying the method of capacity calculation of the battery module according to claim 1;

if it is determined that the increasable capacity of the battery module is not zero, controlling the battery module to perform the power replenishment operation; and if it is determined that the increasable capacity of the battery module is zero, controlling the battery module not to perform the power replenishment operation.

8. A system for capacity calculation of a battery module, comprising:

a battery acquisition module, configured to select a reference battery which meets preset charge and discharge conditions based on historical charge and discharge parameters of each battery in the battery module, and to acquire remaining batteries except the reference battery;

a relative capacity acquisition module, configured to acquire a relative capacity of each of the remaining batteries relative to the reference battery;

a target capacity acquisition module, configured to determine target capacities that meet preset capacity conditions based on the relative capacity of each of the remaining batteries; and an increasable capacity acquisition module, configured to obtain an increasable capacity of the battery module based on the target capacities;

wherein the increasable capacity is equal to a capacity that the battery module can release after the battery module performs a power replenishment operation compared to the capacity that the battery module can release before the power replenishment operation;

wherein the relative capacity acquisition module is further configured to: obtain, based on first historical charge and discharge parameters of the reference battery and second historical charge and discharge parameters of each of the remaining batteries, a chargeable capacity and a dischargeable capacity of each of the remaining batteries relative to the reference battery; and obtain the relative capacity of each of the remaining batteries relative to the reference battery based on a difference between the chargeable capacity and the dischargeable capacity corresponding to each of the remaining batteries;

wherein the target capacity acquisition module is further configured to: obtain, among the dischargeable capacities, a capacity satisfying a first preset capacity condition as a first capacity; and obtain, among the relative capacities, a capacity satisfying a second preset capacity condition as a second capacity; and wherein the increasable capacity acquisition module is further configured to calculate the increasable capacity of the battery module based on the first capacity and the second capacity.

9. A system for power recharge control of a battery module, comprising:

a power replenishment control module, configured to control a power replenishment operation of the battery module, wherein when it is determined that the battery module has a non-zero increasable capacity by applying the method of capacity calculation of the battery module according to claim 8, the power replenishment operation of the battery module is performed; and wherein it is determined that the battery module does not have a non-zero increasable capacity, the power replenishment operation of the battery module is not performed.

10. An electronic device, including a memory, a processor and a computer program stored in the memory and executable on the processor, wherein when the processor executes the computer program, the method for capacity calculation of the battery module according to claim 1 is implemented.

when it is determined that the battery module does not have a non-zero increasable capacity, the power recharge operation of the battery module is not performed.

11. A computer-readable storage medium with a computer program stored thereon, wherein:

when the computer program is executed by a processor, the method for the capacity calculation of the battery module according to claim 1 is implemeneted.

* * * * *